United States Patent [19]

Crowley et al.

[11] Patent Number: 4,573,174

[45] Date of Patent: Feb. 25, 1986

[54] ELECTRONIC POSTAGE METER HAVING INTERLOCK BETWEEN MECHANICAL AND ELECTRICAL REGISTERS

[75] Inventors: Raymond R. Crowley, Newtown; Alton B. Eckert, Norwalk; John H. Soderberg, Stratford, all of Conn.

[73] Assignee: Pitney Bowes Inc., Stamford, Conn.

[21] Appl. No.: 415,514

[22] Filed: Sep. 7, 1982

[51] Int. Cl.[4] .................. G06M 3/12; H03K 21/40

[52] U.S. Cl. .................. 377/39; 377/30; 340/825.3

[58] Field of Search .................. 377/39, 30; 364/464, 364/479, 409, 466; 371/68; 250/231 SE; 340/825.3

[56] References Cited

U.S. PATENT DOCUMENTS

| | | | |
|---|---|---|---|
| 3,588,459 | 6/1971 | Dilger | 377/39 |
| 3,978,327 | 8/1976 | Huber | 371/68 |
| 4,012,717 | 3/1977 | Censier et al. | 371/68 |
| 4,253,015 | 2/1981 | McFiggans et al. | 377/32 |
| 4,287,825 | 9/1981 | Eckert, Jr. et al. | 101/91 |
| 4,301,507 | 11/1981 | Soderberg et al. | 364/704 |

*Primary Examiner*—John S. Heyman
*Assistant Examiner*—Karl Ohralik
*Attorney, Agent, or Firm*—Joseph A. Sawyer, Jr.; William D. Soltow, Jr.; David E. Pitchenik

[57] ABSTRACT

An electronic postage meter includes electronic circuitry for providing an accounting of the number of mailpieces imprinted with postage, and the amount of postage imprinted on such mailpieces. An electro-optic sensor connects with a mechanical drive of a printing drum of the meter to sense successive rotations of the printing drum, one rotation occurring for each imprinting of postage. A comparison circuit compares the one-bit signal provided by the electro-optic sensor with the least significant bit of a count of the mailpieces, which count is provided electronically by the accounting function. Any discrepancy between the least significant bit of the mechanical count and the least significant bit of the electronic count serves as a warning of a malfunction, or of tampering, of the postage unit. An error-signal circuit connected to the comparison circuit terminates operation of the meter upon the occurrence of a discrepancy between the mechanical and electrical counts.

6 Claims, 3 Drawing Figures

ELECTRONIC POSTAGE METER HAVING INTERLOCK BETWEEN MECHANICAL AND ELECTRICAL REGISTERS

BACKGROUND OF THE INVENTION

This invention relates to postage meters, and more particularly, to postage meters incorporating electronic computation circuitry for accounting for postage markings, and further incorporating a mechanical coupling to a printing head for correction of the electronic accounting.

A postage meter incorporating an electronic accounting circuit is disclosed in the U.S. Pat. No. 4,301,507 which issued on Nov. 17, 1981 in the name of Soderberg et al and is assigned to the Pitney-Bowes Corporation. A mechanical drive for the print head of the foregoing postage meter, incorporating electronic sensors thereon for the sensing of the printing drum position, is disclosed in the U.S. Pat. No. 4,253,015 which issued in the name of McFiggans et al on Feb. 24, 1981 and is assigned to the Pitney-Bowes Corporation. A further mechanical drive for the print head is disclosed in the U.S. Pat. No. 4,287,825 which issued on Sept. 8, 1981 in the name of Alton B. Eckert et al and is assigned to the Pitney-Bowes Corporation. The three foregoing patents, U.S. Pat. Nos. 4,301,507, 4,287,825 and 4,253,015, are incorporated herein in their entirety by reference.

In the electronic control of the printing of postage, a microprocessor is advantageously employed in the accounting circuitry. The circuitry may be adapted for recording the number of pieces of mail or parcels which have received pre-designated amounts of postage as well as the sub-total of all postage administered. It is most advantageous for business purposes that such accounting be accomplished with complete accuracy so that all postage is accounted for.

One problem that may arise with respect to the maintenance of the accuracy is associated with a momentary loss of power at the time of the imprinting of the postage on a mailpiece. At the times that this occurs, a question arises as to whether or not the postage was actually imprinted. This problem is overcome in the above-referenced U.S. Pat. No. 4,253,015. The mechanical motion of the printing drum during the printing operation is observed subsequent to the power outage by the sensors affixed to the aforementioned mechanical part. This, in turn, enables the accounting to be corrected to reflect any printing of postage that may have occurred during the momentary power outage.

It is, however, desirable to further increase the reliability of the accounting of the postage, for instance, to cover the situation wherein a person may have attempted to tamper with the meter. In addition to tampering, it must also be recognized that a problem might result from the momentary breakdown in equipment which could adversely affect the accounting of the postage.

SUMMARY OF THE INVENTION

The aforementioned problems are overcome and other advantages are provided by a postage meter incorporating electronic accounting circuitry as well as the foregoing mechanical drive for the printing drum wherein, in accordance with the invention, there is provided an electronic sensor of the mechanical position of the printing drum for developing the least significant bit of a digitally formatted binary number. Such binary number represents the number of revolutions, or increments in position, of the printing head. A corresponding binary number appears in the accounting circuitry. The invention further provides for a comparison circuit to compare the least significant bit of the drum rotations with the least significant bit of the count of mailpieces or parcels by the accounting circuitry. As soon as a discrepancy in the counting of only one mail piece occurs, the comparison circuit notes a difference between the least significant bit of the mechanical and electronic countings. Also, the comparison circuit activates a signal which is applied to the accounting circuitry to terminate further operation of the postage meter until such time as the cause of the discrepancy has been determined.

It is known and understood for the purposes of the present application that the term postage meter refers to the general class of device for the imprinting of a defined unit value for governmental or private carrier delivery of parcels, envelopes, or other like applications for unit value printing. Thus, although the term postage meter is utilized, it is both known and employed in the trade as a general term for devices utilized in conjunction with services other than those exclusively employed by governmental postage and tax services. For example, private parcel and freight services purchase and employ such meters as a means to provide unit value printing and accounting for individual parcels.

BRIEF DESCRIPTION OF THE DRAWINGS

The aforementioned features and other aspects of the invention are explained in the following description, taken in connection with the accompanying drawings wherein.

DESCRIPTION OF THE PREFERRED EMBODIMENT

Figure 1:
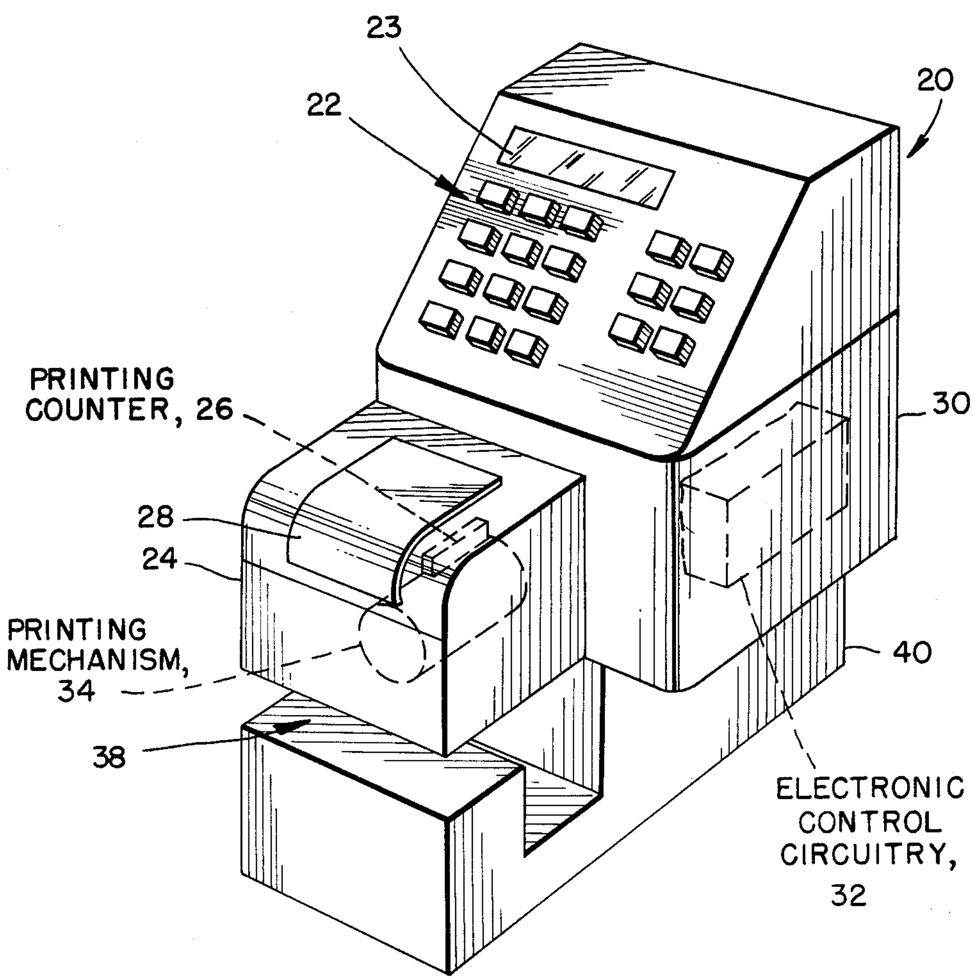
FIG. 1 is a stylized perspective view of a postage meter incorporating the invention, the postage meter including a mechanical printing mechanism for imprinting the postage, the postage meter further including electronic control circuitry for directing the operation of the printing mechanism.

Referring now to FIG. 1, there is shown a postage meter 20 incorporating the invention, the postage meter 20 including a data-entry keyboard 22, a display 23, and a case 24 housing a postage printing mechanism 34 including a mechanically operated, printing counter 26. The printing counter 26 counts consecutive printing cycles in the operation of the meter 20, and prints the count, which may be a serial or invoice number, on a package or mailing label. The case 24 includes a cover 28 which may be opened to provide access to portions of the printing mechanism 34.

A housing 30 of the meter 20 supports the keyboard 22 and incorporates the case 24, the housing 30 enclosing electronic control circuitry 32 while the case 24 encloses mechanism 34. The circuitry 32 and the mechanism 34 are shown in phantom. A parcel, letter or other mailpiece (not shown) is to be inserted in a slot 38 for the imprinting of postage. The housing 30 is configured for mating with a base 40 which supports the meter 20, and includes a well known drive mechanism (not shown) for advancing mailpieces through the slot 38, which slot is located between the housing 30 and the base 40.

Figure 2:
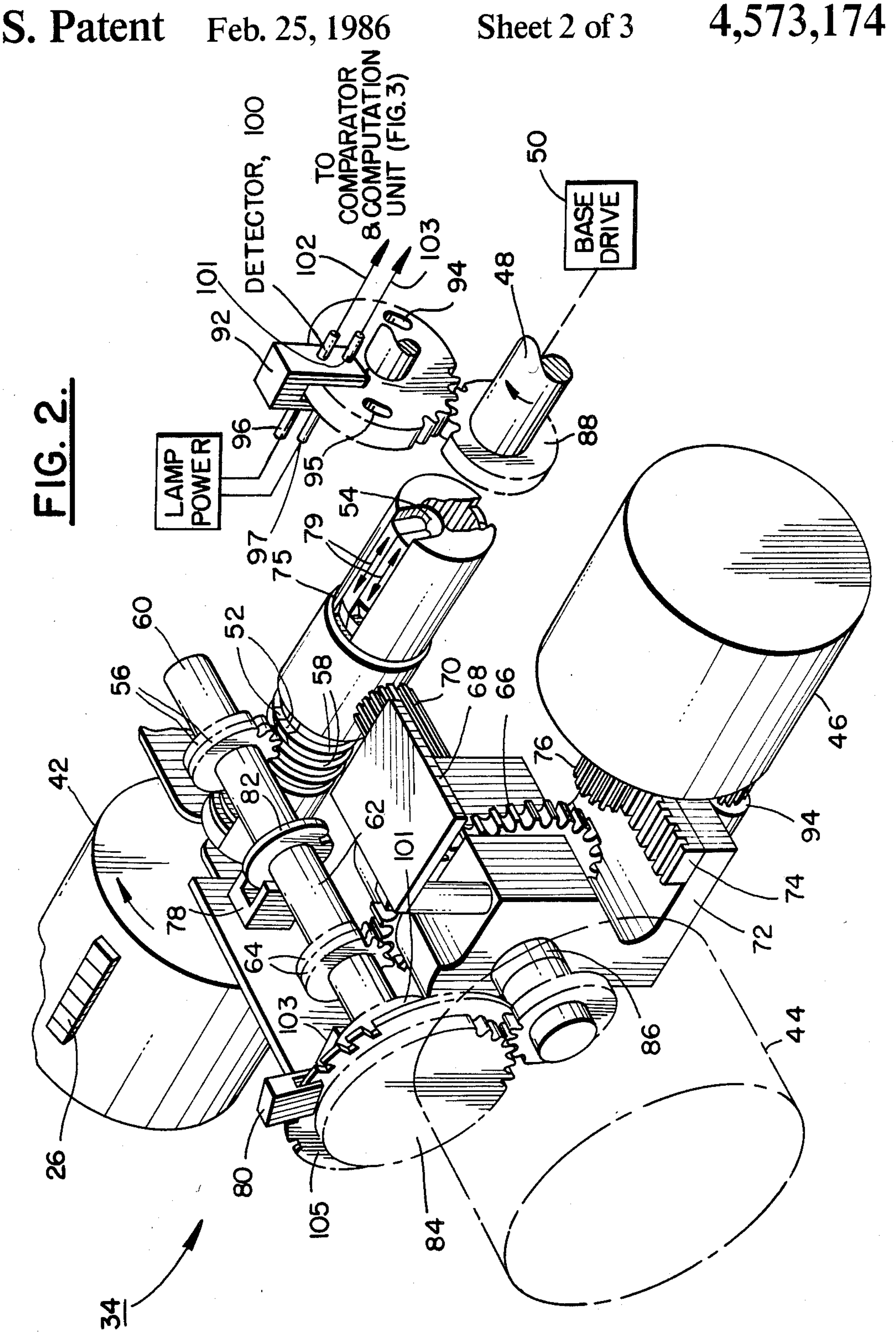
FIG. 2 is a detailed isometric view of the interconnection of mechanical components of the printing mechanism, the view including a printing drum and two stepping motors for operating the printing drum, the figure further showing an electro-optic detection of the position of the printing drum.

Referring now to FIG. 2, a printing mechanism 34 comprises a printing drum 42 having print wheels which are set by two stepping motors 44 and 46. The printing drum 42 includes type (not shown) extending from a portion of the drum 42 for contacting a mailpiece to imprint the correct postage thereon. The printing drum 42 sits alongside the slot 38 (FIG. 1) so as to make contact with a mailpiece. The printing drum 42 makes one rotation during the imprinting of postage upon the mailpiece. A shaft 48 extends along the axis of rotation of the drum 42 for coupling the drum 42 to a drive 50, indicated diagrammatically, of the base 40 (FIG. 1).

The shaft 48 and the drum 42 are rotated by the drive 50 for the imprinting of the postage. The shaft 48 includes an enlarged portion housing racks 52 riding within a channel 54 and having circumferentially extending teeth for mating with pinions 56. The teeth of the racks 52 are in alignment with circumferential ribs 58 of the shaft 48, which ribs are in continuous engagement with the pinions 56 during the rotation of the shaft 48. The continous engagement provides also for the engagement of the pinion 56 with the teeth of the racks 52 in the "home" position of the shaft 48 and the drum 42. During the "home" position, rotation of the pinions 56 advances the racks 52 for arrangement and selection of the type of the printing drum 42 in preparation for the imprinting of postage during the next rotation of the drum 42. The amount of rotation of each of the racks 52, is directed by the stepping motors 44 and 46 in the following manner.

The pinions 56 are connected by concentric shafts 60 and 62, of which the shaft 60 is the inner of the two shafts, while the shaft 62 is of a tubular form enclosing the shaft 60, to corresponding pinions 64. The pinions 64 are individually engageable by a gear 66 carried by a yoke 68 which is translatable on a spline 70. The spline 70 extends from the shaft of the motor 44 and, accordingly, imparts rotation to the gear 66 in response to excitation of the motor 44. Thereby, excitation of the motor 44 imparts rotation, via the gear 66, to a preselected one of the pinions 64 and, thereby, to a preselected one of racks 52.

The selection of the desired one of the pinions 64 to be rotated by the gear 66 is accomplished by a translation of the yoke 68. The yoke 68 includes a shelf 72 extending transversely to the axis of the spline 70 and carrying a rack 74 for engagement with a pinion 76 driven by the motor 46. Thereby, activation of the motor 46 imparts rotation to the pinion 76 which, in turn, advances the rack 74 and the yoke 68 along the axis of the spline 70. By activating the motor 46 to a predetermined amount of rotation to the pinion 76, the yoke 68 and its gear 66 are advanced a predetermined distance along the line 70 for engagement with a preselected one of the pinions 64. Thereby, the motors 44 and 46 direct the movement of the rack 52 for the appropriate selection of the type of the printing heads 42 for imprinting the requisite postage on a mailpiece. Further details in the operation of the printing mechanism 34 are disclosed in the foregoing U.S. Pat. No. 4,253,015. In particular, it is noted that electro-optic sensors 78 and 80 may be employed with tooth wheels 82 and 84 mechanically coupled for rotation with the shaft 86 of the motor 44 to provide electrical signals to the circuitry 32 (FIGS. 1 and 3) designating the positions of the racks 52.

In accordance with a feature of the invention, the shaft 48 carries a pinion 88 which drives a gear 90 through a speed reduction ratio of 2:1. Thus, the gear 90 makes one-half revolution for every full revolution of the printing drum 42. An electro-optic sensing assembly 92 senses the positions of a hole 94 and a hole 95 drilled through the gear 90 at different radii from the center of the gear 90. The sensing assembly 92 includes a lamp 96 and a lamp 97 energized by a source 98 of lamp power (indicated diagrammatically), and detectors 100 and 101 of the light of the lamp 96 for converting such light to electric signals on lines 102 and 103.

Thus, when the hole 94 is in alignment with the lamp 96 and the detector 100, light from the lamp 96 passes through the hole 94 to illuminate the detector 100, whereupon a logic 1 signal appears on a line 102. Similarly, the hole 95 provides a logic 1 signal on line 103. Due to the foregoing 2:1 ratio and the amounts of rotation between the pinion 88 and the gear 90, or equivalently, between the drum 42 and the gear 90, a logic 1 signal appears on the line 102 for alternate imprinting of postage by the printing drum 42, while the logic 0 appears on the line 102 for the other imprintings of postage by the drum 42. Corresponding logic 0 and logic 1 signals appear on line 103. Accordingly, the arrangement of the pinion 88, the gear 90, the hole 94 and the sensing assembly 92 provides for an off/even or one-bit counting of the mailpieces upon which the postage has been imprinted. The electric signals on lines 102 and 103 are coupled to the circuitry 32 (FIGS. 1 and 3) to monitor the accounting operation of the circuitry 32 as will now be described.

Figure 3:
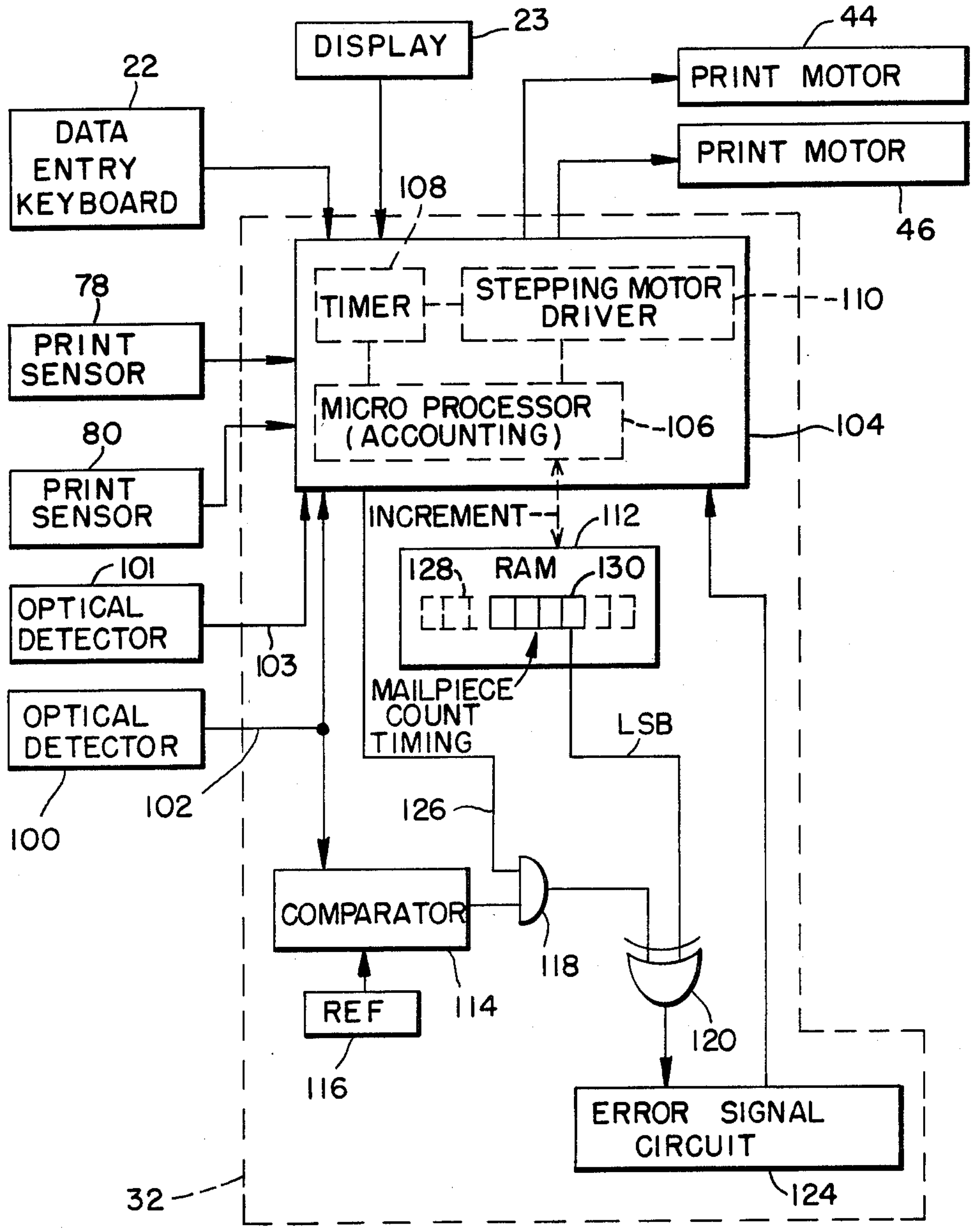
FIG. 3 is a block diagram of electronic circuitry providing for the comparison between the signals of the electro-optical detector and the count of accounting circuitry in accordance with the invention.

Referring now to FIG. 3, there are shown the components of the electronic control circuitry 32, and its connection with other components, already described, of the postage meter 20 of FIGS. 1 and 2. Thus, FIG. 3 shows the keyboard 22, the stepping motors 44 and 46 of the printing operation, the sensor 78 and 80 of the printing operation, and the detectors 100 and 101 for sensing each home position of the drum 42, all of which have been described in FIG. 2.

The circuitry 32 comprises a computation unit 104 which includes a well-known microprocessor 106 for accounting purposes, a timer 108 and a driver 110 of pulses for energizing the motors 44 and 46. The microprocessor 106, the timer 108 and the driver 110 are coupled together for selecting the requisite amount of postage and providing an accurate accounting of the amount of postage and the amount of mailpieces. This information is provided to an operator of the meter 20 through use of the keyboard 22 and display 23. In addition, the circuitry 32 includes a random-access memory 112, a comparator 114, a source 116 of reference voltage for the comparator 114, an AND gate 118, an exclusive-OR gate 120, and an error signal circuit 124.

In operation, the output of the detector 100, on line 102, is applied to the comparator 114 for comparison against the reference of the source 116. Upon detection of the incident light via the hole 94 (FIG. 2), the voltage on the line 102 is greater than that of the source 116 in which case the comparator 114 provides a logic 1 signal at its output terminal. In the event that the hole 94 is not in alignment with the lamp 96 and the detector 100, the light is not detected and the output voltage of the detector 100, on line 102, is less than the reference voltage of the source 116 in which case the comparator 114 outputs a logic 0. The output terminal of the comparator 114 is coupled to an input terminal of the AND gate 118, the other input terminal of the AND gate 118 being energized with a timing or enable signal on line 126 from the computation unit 104. Thereby, the AND gate 118, in response to the timing signal on line 126, samples the output signal of the comparator 114 to provide the one-bit count of the rotations of the printing drum 42 at the requisite instants of time when the positions of the drum 42 are to be observed.

The detector signals on lines 102–103 are also coupled to the computation unit 104 for operation of the electronic counting of the mailpieces and the accounting for the amount of postage dispensed. The computation unit 104 is understood to comprise comparators (not shown) such as the comparator 114 for quantizing the detector signals on the lines 102–103. Thus the computation unit 104, is responsive to a 2-bit signal for generation of the enable signal on line 126. The memory 112 has a storage cells 128 for the storing of digitally formatted data. A portion of the cells 128, shown in heavier lines in the drawing, are reserved for the counting of the mailpieces, and thus serve as a register 130 for the storing of the count. The memory 112 is coupled to the microprocessor 106 whereby the register is incremented by a count of one for each detector signal on line 102 designating the entry of an additional mailpiece in the slot 38 (FIG. 1). One cell of the register 130 always contains the least significant bit (LSB) of the count. The one-bit signal at the output terminal of the AND gate 118 is also the least significant bit of the counting of the mailpieces, since the drum 42 performs one revolution per mailpiece.

In accordance with the invention, the least significant bit provided by the gate 118, from the sensing of mechanical rotation via the electro-optic assembly 92 (FIG. 2), and the least significant bit provided by the memory 112, from the electronic counting, are compared. A suitable comparison circuit is provided by the exclusive-OR gate 120. Thus, the LSB signal provided of the gate 118 should be equal to the LSB signal of the memory 112. In accordance of the operation of the gate 120, in the event that both LSB signals are at logic 0 or at logic 1, the gate 120 outputs a logic 0 to the error-signal circuit 124 which remains deactivated. However, in the event that the LSB signal of the gate 118 differs from the LSB signal of the memory 112, then the gate 120 outputs a logic 1 which activates the circuit 124 to apply a digital error signal to the computation unit 104. The error signal directs the computation 104 to cease further operation, until such time as it may be reactivated by an authorized operator of the postage meter 20.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A tamper resistent postage meter for imprinting postage on mailpieces comprising:

(a) print drum means for imprinting postage on the mailpieces;

(b) drive means for operating said drum means, said drive means including a mechanical counter of rotation of said drum means;

(c) electronic circuitry coupled to said drive means for designating amounts of postage to be imprinted by said drum means;

(d) means coupled to said electronic circuitry for detecting the number of rotations of the drum means, said electronic circuitry including an electronic counter of the number of mailpieces receiving postage;

(e) means coupled to said mechanical counter and said electrical counter for comparing the least significant bit of the count of the mechanical counter with the least signficant bit of the count of the electronic counter for the detection of possible tampering from any discrepancies between the two counts; and (f) means coupled to the comparing means for signaling the electronic circuitry to terminate further operation of said meter until serviced by a qualified serviceman.

2. A meter according to claim 1 wherein said detecting means includes an electro-optic coupling between said drive means and said electronic circuitry for signaling the number of rotations of the drum means.

3. A meter according to claim 1 wherein the mechanical counter of said drive means comprises an optically transmissive structure and an electro-optic sensor of light transmitted by said structure, said structure providing light regions and dark regions for the production of digitally formatted, one-bit electric signals designated from said sensor designated printing of said drum means.

4. A meter according to claim 3 wherein said print drum means is rotatable by said drive means and wherein signals provided by said electro-optic sensor designate amounts of rotation of said drum means.

5. A meter according to claim 4 wherein said mechanical counter comprises a pinion connected to a shaft extending from said drum means, said mechanical counter further comprising a gear driven by said pinion in a speed reduction ration of 2:1, said optically transmissive structure being associated with said gear to provide synchronization between rotations of said drum means and the signals of said electro-optic sensor, the speed-reduction ratio providing alternating states of logic 1 and logic 0 to signals provided by said sensor in response to successive rotations of said drum means.

6. A tamper resistent postage meter comprising:

(a) a rotatable printing drum for the imprinting of postage on mailpieces;

(b) means, mechanically coupled to said drum, for providing a binary signal having states of logic 1 and logic 0, said binary signal being a one-bit signal wherein said state of logic 1 appears for alternate rotations of said drum;

(c) means for electronically counting the occurrences of rotation by said printing drum;

(d) means coupled between said binary-signal providing means and said counting means for comparing said one-bit signal with the least significant bit of said counting means, and (e) means coupled to said comparison means for signaling said meter to terminate further imprinting of postage upon the occurrence of a difference between said one-bit signal and the least significant bit of said counting means until said meter is serviced by a qualified serviceman.

* * * * *